United States Patent
Hoya (10) Patent No.: US 9,626,128 B2
(45) Date of Patent: Apr. 18, 2017

(54) SEMICONDUCTOR MEMORY DEVICE (71) Applicant: KABUSHIKI KAISHA TOSHIBA, Tokyo (JP)

(72) Inventor: Katsuhiko Hoya, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 868 days.

(21) Appl. No.: 13/931,273

(22) Filed: Jun. 28, 2013

(65) Prior Publication Data

US 2014/0068154 A1 Mar. 6, 2014

(30) Foreign Application Priority Data

Sep. 6, 2012 (JP) ................... 2012-196654

(51) Int. Cl.
*G06F 3/06* (2006.01)
*G06F 12/16* (2006.01)
*G11C 11/00* (2006.01)
*G11C 7/10* (2006.01)
*G11C 7/22* (2006.01)
*G11C 8/18* (2006.01)
*G06F 13/16* (2006.01)
*G11C 29/04* (2006.01)

(52) U.S. Cl.
CPC .......... *G06F 3/0688* (2013.01); *G06F 3/0622* (2013.01); *G06F 3/0629* (2013.01); *G06F 13/1668* (2013.01); *G11C 7/1006* (2013.01); *G11C 7/22* (2013.01); *G11C 8/18* (2013.01); *G11C 11/005* (2013.01); *G11C 2029/0411* (2013.01); *Y02B 60/1228* (2013.01)

(58) Field of Classification Search
CPC .... G06F 3/0622; G06F 3/0629; G06F 3/0688; G06F 13/1668; G11C 11/005; G11C 7/1006; G11C 7/22
See application file for complete search history.

(56) References Cited

U.S. PATENT DOCUMENTS

| | | | | |
|---|---|---|---|---|
| 5,787,457 A | * | 7/1998 | Miller | G06F 12/0893 711/105 |
| 2001/0010651 A1 | | 8/2001 | Nakaya et al. | |
| 2001/0042180 A1 | * | 11/2001 | Laberge | G06F 13/4239 711/154 |
| 2002/0040416 A1 | * | 4/2002 | Tsern | G06F 1/3203 711/105 |
| 2005/0235126 A1 | * | 10/2005 | Ko | G06F 9/5016 711/170 |
| 2006/0156213 A1 | | 7/2006 | Kikutake et al. | |
| 2009/0024790 A1 | * | 1/2009 | Rajan | G11C 11/4063 711/105 |
| 2011/0055495 A1 | * | 3/2011 | Wolford | G06F 13/1694 711/154 |
| 2012/0243304 A1 | | 9/2012 | Hoya | |

FOREIGN PATENT DOCUMENTS

JP    2000-149598    5/2000

* cited by examiner

*Primary Examiner* — Aracelis Ruiz
(74) *Attorney, Agent, or Firm* — Holtz, Holtz & Volek PC (57) ABSTRACT

According to one embodiment, a semiconductor memory device includes a first memory circuit and a first controller. The first memory circuit includes a register in which a read page size is stored, and a memory cell array. The first controller is configured to access the first memory circuit by the page size stored in the register, in one of an open page policy and closed page policy.

16 Claims, 10 Drawing Sheets

| | RDt <i> | RDt <j> | RDERR | | TM_MODE |
|---|---|---|---|---|---|
| All"0" mode | 0 | 0 | 0 | pass | VSS |
| | 0 | 1 | 1 | fail | |
| | 1 | 0 | 1 | fail | |
| | 1 | 1 | 1 | fail | |
| All"1" mode | 0 | 0 | 1 | fail | VDD |
| | 0 | 1 | 1 | fail | |
| | 1 | 0 | 1 | fail | |
| | 1 | 1 | 0 | pass | |
| Random mode | 0 | 0 | 0 | pass | RDt |
| | 0 | 1 | 1 | fail | |
| | 1 | 0 | 1 | fail | |
| | 1 | 1 | 0 | pass | |

F I G. 10

180# SEMICONDUCTOR MEMORY DEVICE

CROSS-REFERENCE TO RELATED APPLICATIONS

This application is based upon and claims the benefit of priority from Japanese Patent Application No. 2012-196654, filed Sep. 6, 2012, the entire contents of which are incorporated herein by reference.

FIELD

Embodiments described herein relate generally to a semiconductor memory device.

BACKGROUND

Conventionally, 2 or 4 KB, for example, is adopted as a page size of a semiconductor memory device such as a DRAM due to the restrictions on refresh or the like.

Also, when a data compression circuit (DQ compression circuit) is incorporated, the number of signal lines generally increases due to the DQ compression circuit. In addition, a circuit area for forming data signal lines also increases.

Conventionally, the DQ compression circuit is formed in addition to an ECC circuit, and the output of the DQ compression circuit is connected to an output destination independently of the ECC circuit. This increases both the number of lines and the circuit area.

DETAILED DESCRIPTION

Semiconductor memory devices according to embodiments will be explained below with reference to the accompanying drawing. Note that in the following explanation, the same reference numerals denote constituent elements having the same functions and configurations, and a repetitive explanation will be made only when necessary.

In general, according to one embodiment, a semiconductor memory device includes a first memory circuit and a first controller. The first memory circuit includes a register in which a read page size is stored, and a memory cell array. The first controller is configured to access the first memory circuit by the page size stored in the register, in one of an open page policy and closed page policy.

1. First Embodiment

Figure 1:
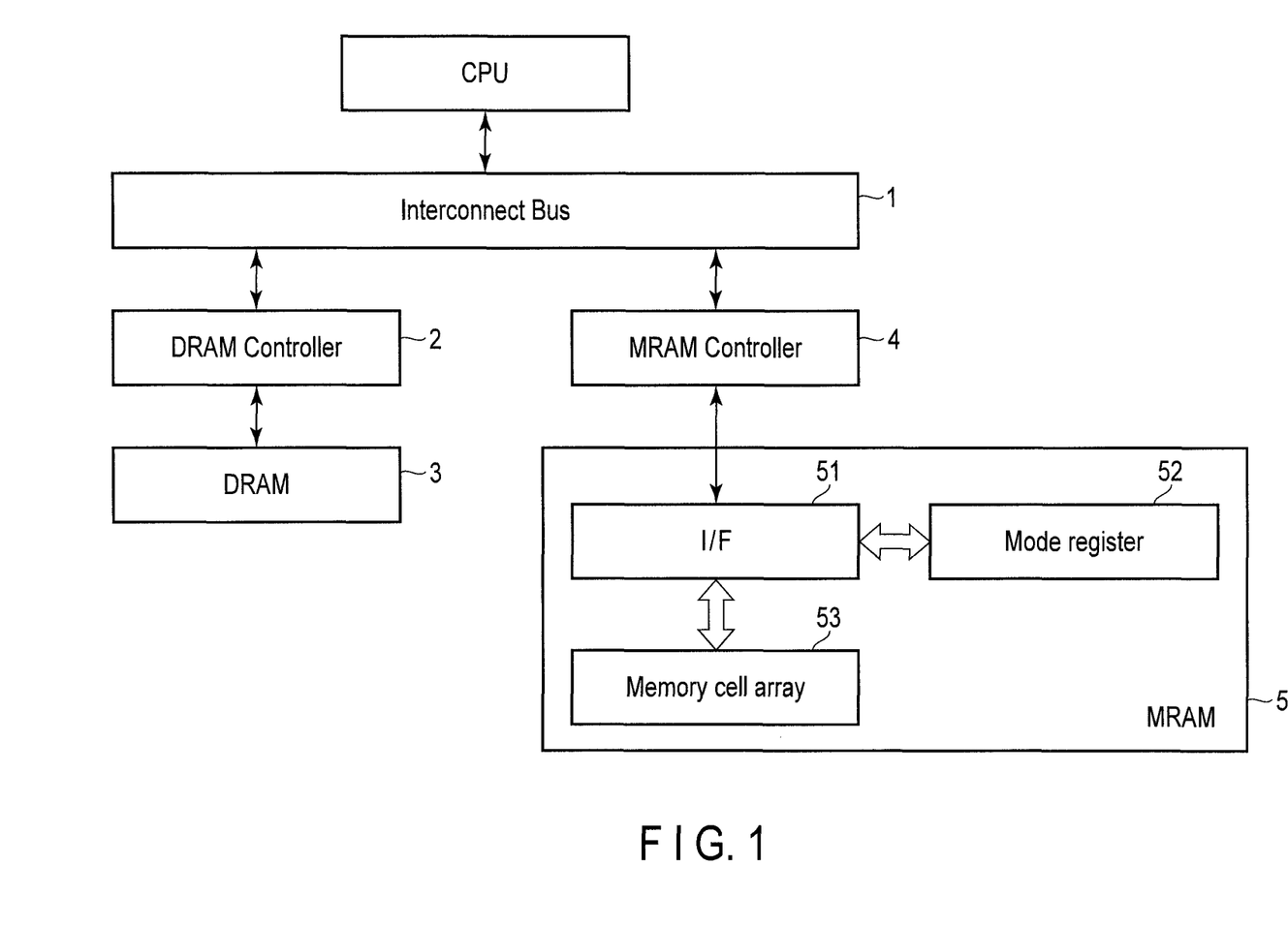
FIG. 1 is a block diagram showing the configuration of a semiconductor memory device of a first embodiment.

FIG. 1 is a block diagram showing the configuration of a semiconductor memory device according to the first embodiment.

As shown in FIG. 1, a DRAM controller 2 is connected to an interconnect bus 1, and a memory circuit such as a dynamic random access memory (DRAM) 3 is connected to the DRAM controller 2. Also, an MRAM controller 4 is connected to the interconnect bus 1, and a memory circuit such as a magnetic random access memory (MRAM) 5 is connected to the MRAM controller 4. In addition, a central processing unit (CPU) 6 formed outside the semiconductor memory device is connected to the interconnect bus 1.

In other words, the DRAM 3 and DRAM controller 2 are connected, and the DRAM controller 2 is connected to the CPU 6 via the interconnect bus 1. Also, the MRAM 5 and MRAM controller 4 are connected, and the MRAM controller 4 is connected to the CPU 6 via the interconnect bus 1.

The DRAM 3 includes a plurality of memory cells. The DRAM controller 2 controls the operation of the DRAM 3. The MRAM 5 includes an interface 51, mode register 52, and memory cell array 53. The interface 51 exchanges signals between the MRAM controller 4 and MRAM 5. The mode register 52 stores a signal indicating an open page policy or closed page policy. The mode register 52 also stores the page size of the open page policy or closed page policy. The memory cell array 53 includes a plurality of memory cells each including a magnetic tunnel junction (MTJ) element. When access to the memory cell array 53 is complete in the open page policy, the process is terminated without precharging the accessed memory cell. When access to the memory cell array 53 is complete in the closed page policy, the process is terminated after the accessed memory cell is precharged.

One of the open page policy and closed page policy is used as a method of controlling access to the DRAM 3 and MRAM 5 in the semiconductor memory device.

When a memory cell array is precharged and closed, the next access to the memory cell array is always performed at a predetermined speed regardless of an address. On the other hand, when a memory cell array is not precharged but open and an open page of the memory cell array is accessed, it is unnecessary to open the page, so the page can be accessed faster than when the memory cell array is closed. However, when accessing a page different from the open page of the memory cell array, it is necessary to precharge the memory cell array and open the page to be accessed. This makes the access speed lower than that when the memory cell array is closed. Accessing the same page is called a "page hit", and accessing a different page is called a "miss hit".

Next, a method of controlling access to the DRAM 3 will be explained.

In the DRAM 3, a page policy control signal for setting the open page policy or closed page policy is supplied from the CPU 6 to the DRAM controller 2. Based on the received page policy control signal, the DRAM controller 2 sets the open page policy or closed page policy as the access control method. In accordance with the set page policy, the DRAM controller 2 accesses the DRAM 3 by the open page policy or closed page policy.

A method of controlling access to the MRAM 5 will now be explained.

The page policy control signal is supplied from the CPU 6 to the MRAM controller 4, and then supplied to the MRAM 5 via the MRAM controller 4. The MRAM 5 includes the mode register 52 as described previously. The mode register 52 stores a signal indicating the open page policy or closed page policy, and a page size. Based on the received page policy control signal, the MRAM controller 4 sets the open page policy or closed page policy as the access control method. In accordance with the set page policy and the page size stored in the mode register 52, the MRAM controller 4 accesses the MRAM 5 by the open page policy or closed page policy.

Figure 2:
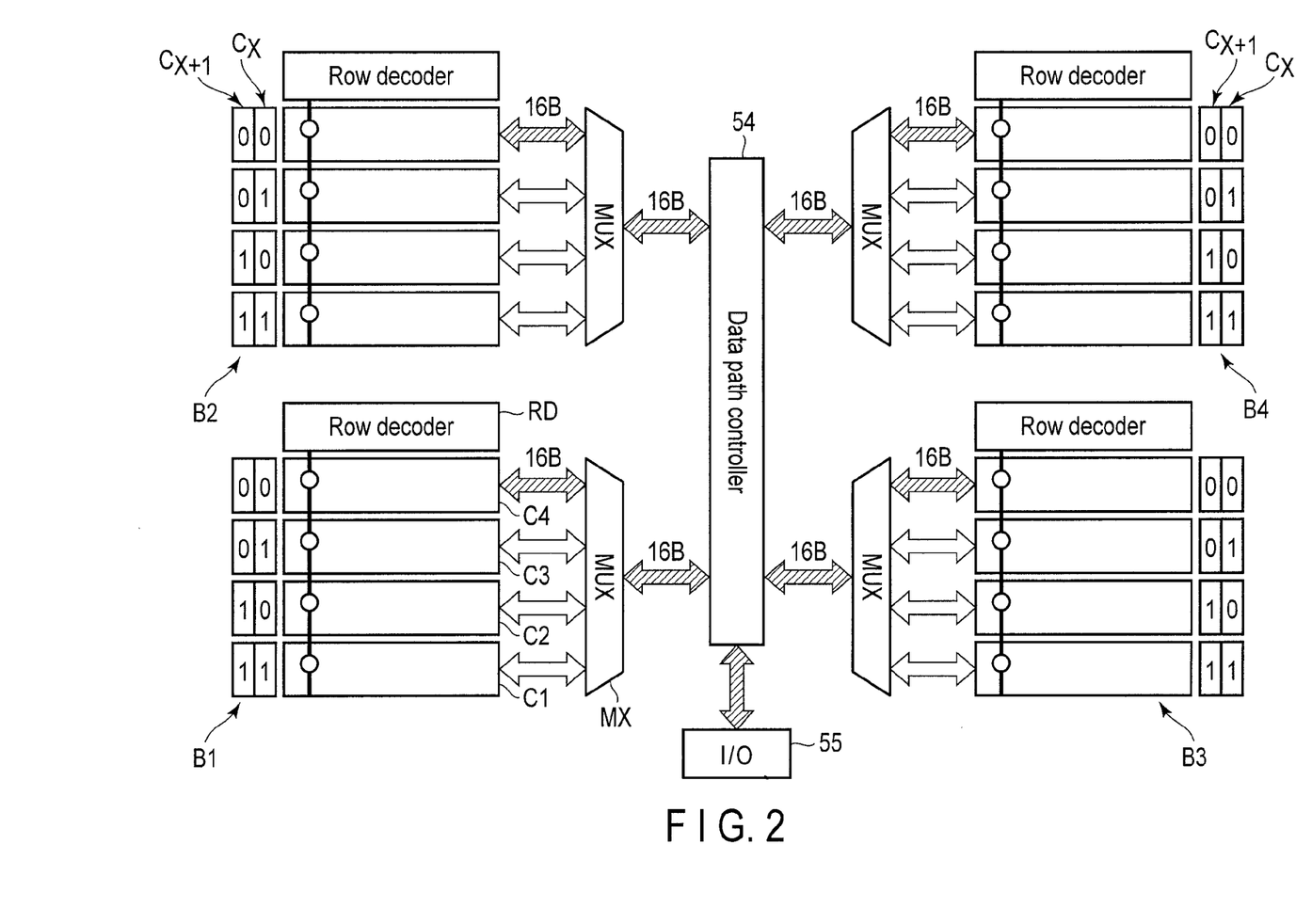
FIGS. 2 and 3 are views showing outlines of data transfer in an MRAM according to the first embodiment.
Figure 3:
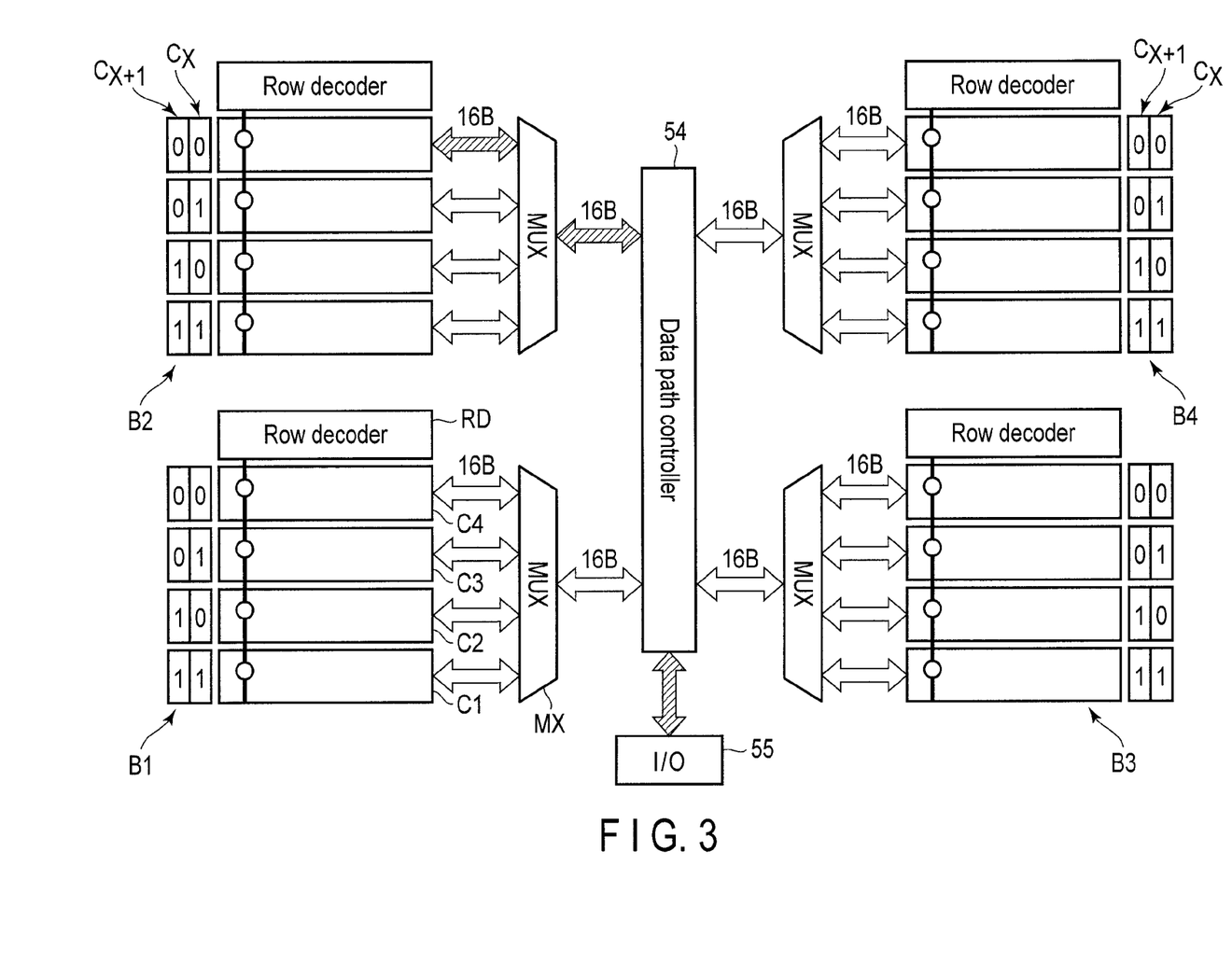

FIGS. 2 and 3 are views showing outlines of data transfer in the MRAM according to the first embodiment. FIG. 2 shows data transfer when using the open page policy, and FIG. 3 shows data transfer when using the closed page policy.

As shown in FIGS. 2 and 3, blocks B1 to B4 are connected to an input/output circuit 55 via a data path controller 54. Blocks B1 to B4 each include cell arrays C1 to C4, a row decoder RD, and a multiplexer MX. Cell arrays C1 to C4 are designated by column addresses $C_X$ and $C_{X+1}$. The row decoder RD selects a memory cell in a cell array. The multiplexer MX selects one of cell arrays C1 to C4. A plurality of memory cells are arranged in each of cell arrays C1 to C4, and each memory cell includes a magnetic tunnel junction (MTJ) element.

Data read from, for example, cell array C4 in block B2 is input to the input/output circuit 55 via the multiplexer MX and data path controller 54. Also, write data output from the input/output circuit 55 is written in cell array C4 of block B2 via the data path controller 54 and multiplexer MX.

In a read operation using the open page policy as shown in FIG. 2, page read is performed from cell array C4 in blocks B1 to B4. After that, blocks B1 to B4 are not precharged but opened in order to make a burst operation possible. When accessing the already opened page, therefore, high-speed access is possible because the page need not be opened. This increases the transfer rate of read data. Although FIG. 2 shows processing when the page size is 64B, the page size has no upper limit and hence can be larger than 64B.

On the other hand, when using the closed page policy as shown in FIG. 3, a read command is a sufficient unit as a read size, so 16B data is read from cell array C4 in block B2. After that, block B2 is precharged and closed. Furthermore, when adding read data, a read command need only be reissued, and a size required for access can be read. This makes it possible to reduce the power, i.e., reduce the power consumption.

Figure 4:
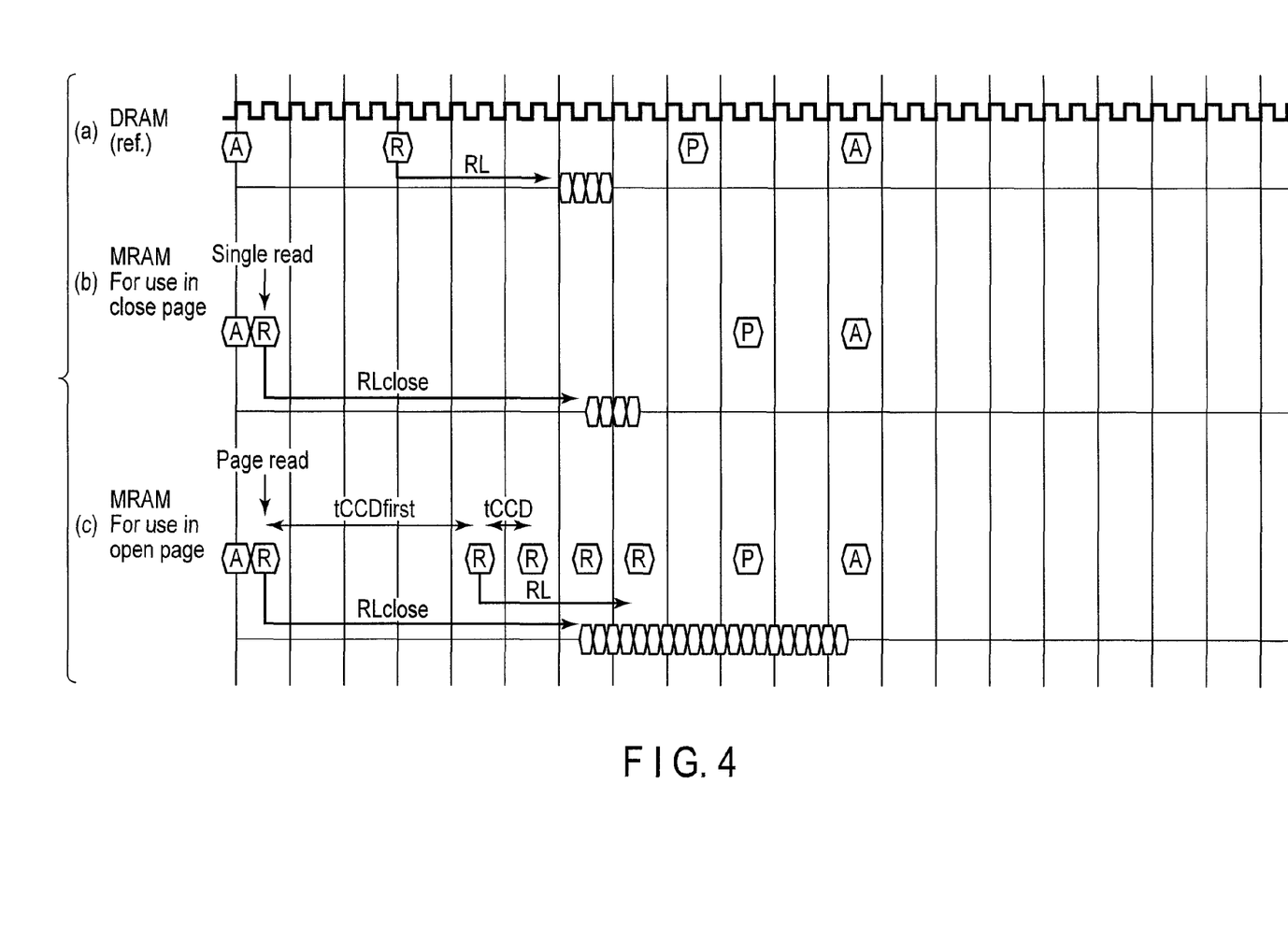
FIGS. 4 and 5 are read timing charts of a DRAM and the MRAM according to the first embodiment.

FIG. 4 is a read timing chart of the DRAM and MRAM according to the first embodiment.

In the DRAM 3, after an active command (A) is input, a read command (R) is input, and data is read as indicated by (a) in FIG. 4. In this state, a latency RL is applied from the read command input timing to the data read timing.

When using the closed page policy in the MRAM 5, as indicated by (b) in FIG. 4, only single data is read by the read command (R) after the active command (A). In this state, a latency RLclose is applied from the read command input timing to the data read timing.

By contrast, when using the open page policy, page read is performed as indicated by (c) in FIG. 4. Even when using the open page policy, the latency RLclose is applied until first data is read. After the data is read, it is necessary to wait for tCCD first min until the next read command. After that, a burst operation becomes possible, and it is only necessary to wait for tCCD min until the next read command. In the burst operation, the latency RL is possible as in the case of the DRAM.

In the read operations shown in FIG. 4, two types of latencies, i.e., the open page policy latency RL and closed page policy latency RLclose exist. That is, the read operations shown in FIG. 4 require the two types of latencies.

Figure 5:
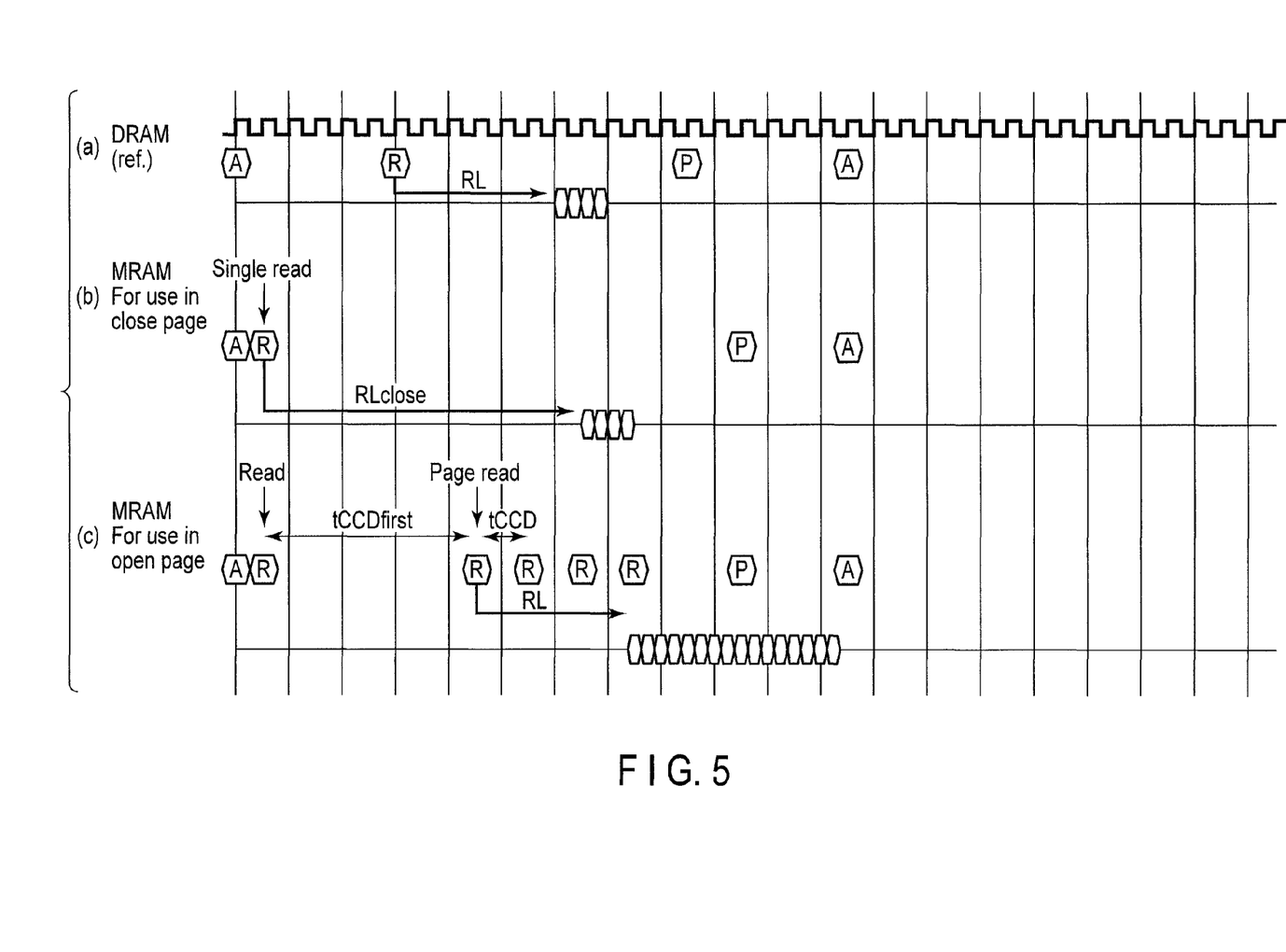

In read operations shown in FIG. 5, read is performed by the read command (R) following the active command (A) as indicated by (c) in FIG. 5, but this read operation is to merely transfer data from the memory cell array to the page buffer in the MRAM 5. That is, no data is output from the MRAM 5 in this read operation. Then, page read is performed by the next read command. After that, a burst operation becomes possible. In this burst operation, the latency RL is possible as in the case of the DRAM. Consequently, only one type of latency needs to be used in the open page policy and closed page policy.

The memory access control method is one of the open page policy by which when access to a memory is complete, the process is terminated without precharging the accessed cell array, and the closed page policy by which the process is terminated after the accessed cell array is precharged.

The closed page policy normally requires no large page size because a read operation and precharge operation are performed as a set. In the DRAM, for example, the page size is, for example, 2 or 4 KB due to restrictions on refresh or the like. If read is performed by a large page size such as 2 or 4 KB in the DRAM, unnecessary data is read, and the power is lost.

On the other hand, the page size can be changed in the MRAM. In the MRAM, it is possible to perform access corresponding to a read command suitable for the closed page policy, but the access time is longer than that in the DRAM.

In the closed page policy, power is normally lost because unnecessary data access is performed. On the other hand, if specifications are specialized for the closed page policy, the performance deteriorates when using the open page policy.

In the first embodiment, the MRAM includes the mode register, and a page size matching the access control method of the MRAM is set. This makes it possible to optimize the power and performance. That is, the power consumption and operating speed can be optimized. In addition, it is possible to provide memory specifications that facilitate controller designing.

2. Second Embodiment

In the second embodiment, data compression and error checking and correction (ECC) calculations executable when setting the open page policy described above will be explained.

Figure 6:
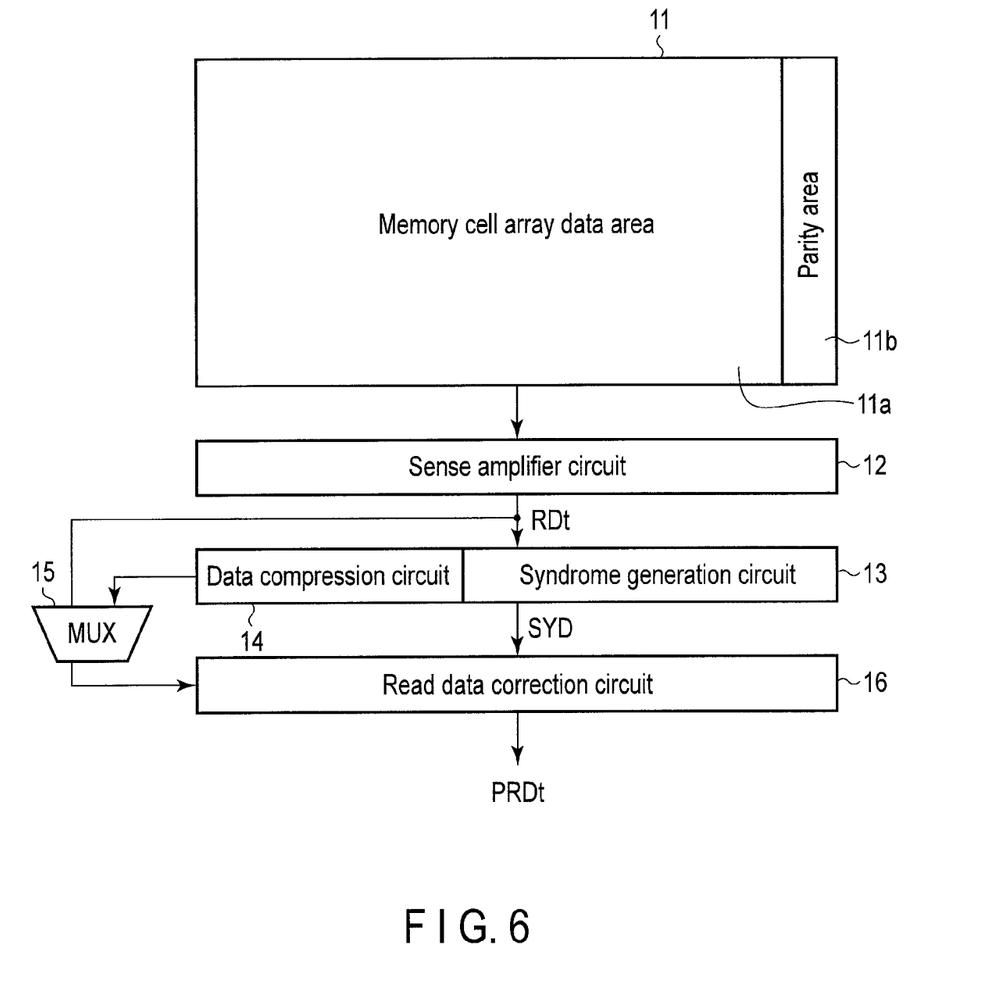
FIG. 6 is a block diagram showing the configuration of a semiconductor memory device of a second embodiment.

FIG. 6 is a block diagram showing the configuration of a semiconductor memory device of the second embodiment.

As shown in FIG. 6, the semiconductor memory device includes a memory cell array 11, sense amplifier circuit 12, syndrome generation circuit 13, data compression circuit 14, multiplexer (MUX) 15, and read data correction circuit 16.

The memory cell array 11 includes a data area 11a and parity area 11b. A plurality of memory cells for storing data are arranged in the data area 11a. A plurality of memory cells for storing parity bits are arranged in the parity area 11b. The sense amplifier circuit 12 reads data stored in the memory cell array 11.

The syndrome generation circuit 13 generates a syndrome signal SYD based on data RDt read from the memory cell array 11 by the sense amplifier circuit 12. The data compression circuit 14 compresses the data RDt read from the memory cell array 11, and outputs the compressed data to the multiplexer 15.

The multiplexer 15 receives the data compressed by the data compression circuit 14, and the data RDt read from the memory cell array 11. The multiplexer 15 selects one of these data, and outputs the selected data to the read data correction circuit 16.

The read data correction circuit 16 decodes the syndrome signal SYD, thereby correcting an error of the data RDt read from the memory cell array 11. Then, the read data correction circuit 16 outputs the error-corrected data or the data output from the multiplexer 15.

Figure 7:
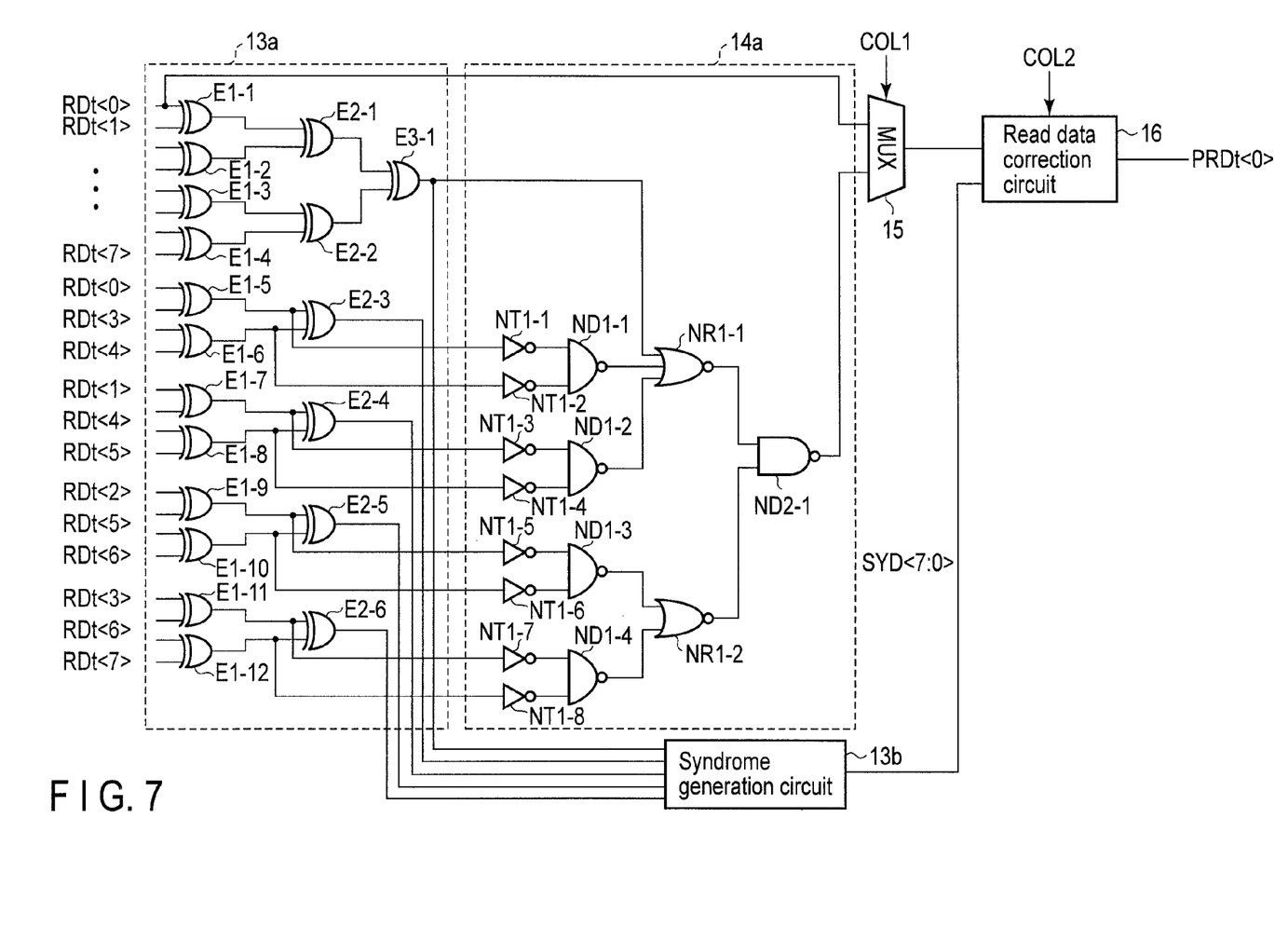
FIG. 7 is a circuit diagram of a data compression circuit and syndrome generation circuit in the semiconductor memory device of the second embodiment.

FIG. 7 is a circuit diagram showing the configuration of the data compression circuit and syndrome generation circuit in the semiconductor memory device of the second embodiment.

The syndrome generation circuit 13 includes circuits 13*a* and 13*b* forming the syndrome generation circuit. The data compression circuit 14 includes an additional circuit 14*a* for data compression and circuit 13*a*. The syndrome generation circuit 13 and data compression circuit 14 share circuit 13*a*.

As shown in FIG. 7, circuit 13*a* of the data compression circuit 14 includes EX-OR gates arranged in a plurality of stages. Data RDt<0>, RDt<1>, . . . , RDt<7> are respectively input to the input terminals of EX-OR gates E1-1, E1-2, E1-3, and E1-4. Outputs from EX-OR gates E1-1 and E1-2 are input to the input terminals of an EX-OR gate E1-1. Outputs from EX-OR gates E1-3 and E14 are input to the input terminals of an EX-OR gate E2-2. Outputs from EX-OR gates E2-1 and E2-2 are input to the input terminals of an EX-OR gate E3-1.

For example, data RDt<0>, RDt<3>, and RDt<4>, and adjustment bit data are respectively input to the input terminals of EX-OR gates E1-5 and E1-6. Outputs from EX-OR gates E1-5 and E1-6 are input to the input terminals of an EX-OR gate E2-3.

For example, data RDt<1>, RDt<4>, and RDt<5>, and the adjustment bit data are respectively input to the input terminals of EX-OR gates E1-7 and E1-8. Outputs from EX-OR gates E1-7 and E1-8 are input to the input terminals of an EX-OR gate E2-4.

For example, data RDt<2>, RDt<5>, and RDt<6>, and the adjustment bit data are respectively input to the input terminals of EX-OR gates E1-9 and E1-10 . Outputs from EX-OR gates E1-9 and E1-10 are input to the input terminals of an EX-OR gate E2-5.

For example, data RDt<3>, RDt<6>, and RDt<7>, and the adjustment bit data are respectively input to the input terminals of EX-OR gates E1-11 and E1-12. Outputs from EX-OR gates E1-11 and E1-12 are input to the input terminals of an EX-OR gate E2-6.

As shown in FIG. 7, the additional circuit 14*a* of the data compression circuit 14 includes a plurality of NOT gates, a plurality of NAND gates, and a plurality of NOR gates.

The output from EX-OR gate E1-5 is input to the input terminal of a NOT gate NT1-1. The output from EX-OR gate E1-6 is input to the input terminal of a NOT gate NT1-2. The output from EX-OR gate E1-7 is input to the input terminal of NOT gate NT1-3. The output from EX-OR gate E1-8 is input to the input terminal of NOT gate NT1-4.

Outputs from NOT gates NT1-1 and NT1-2 are input to the input terminals of a NAND gate ND1-1. Outputs from NOT gates NT1-3 and NT1-4 are input to the input terminals of a NAND gate ND1-2. Outputs from EX-OR gate E3-1 and NAND gates ND1-1 and ND1-2 are input to the input terminals of a NOR gate NR1-1.

Outputs from NOT gates NT1-5 and NT1-6 are input to the input terminal of a NAND gate ND1-3. Outputs from NOT gates NT1-7 and NT1-8 are input to the input terminals of a NAND gate ND1-4. Outputs from NAND gates ND1-3 and ND1-4 are input to the input terminals of a NOR gate NR1-2.

Outputs from NOR gates NR1-1 and NR1-2 are input to the input terminals of a NAND gate ND2-1. An output from NAND gate ND2-1 and data RDt<0> are input to the input terminals of the multiplexer 15. The multiplexer 15 selects one of the output from NAND gate ND2-1 and data RDt<0> in accordance with a control signal COL1, and outputs the selected data to the read data correction circuit 16.

Also, outputs from EX-OR gates E3-1, E2-3, E2-4, E2-5, and E2-6 are input to circuit 13*b* forming the syndrome generation circuit. The syndrome generation circuit 13*b* generates the syndrome signal SYD, and outputs the signal to the read data correction circuit 16.

The read data correction circuit 16 receives the syndrome signal SYD and the output from the multiplexer 15. As described previously, the read data correction circuit 16 decodes the syndrome signal SYD, and corrects an error of the data Rdt read from the memory cell array 11. Then, the read data correction circuit 16 outputs the error-corrected data or the data output from the multiplexer 15, as output data PRDt.

In the circuit configuration as shown in FIG. 7, circuit 13*a* forming parts of the data compression circuit and syndrome generation circuit, circuit 13*b*, and the read data correction circuit 16 form an ECC circuit. Circuit 13*a* forms a part of the ECC circuit.

When performing ECC calculations, the path for generating the syndrome signal SYD by the syndrome generation circuits 13*a* and 13*b* is a critical path, and the data compression circuit (the additional circuit 14*a* for data compression and circuit 13*a*) is not a critical path. In this embodiment, therefore, the syndrome generation circuit can be incorporated without deteriorating the performance of the ECC calculations. Also, a part of the ECC circuit, i.e., circuit 13*a* forming the syndrome generation circuit is used as a part of the data compression circuit. This makes it possible to reduce an increase in area necessary to form data signal lines.

Next, an outline of data scramble in the second embodiment will be explained with reference to FIG. 8.

Figure 8:
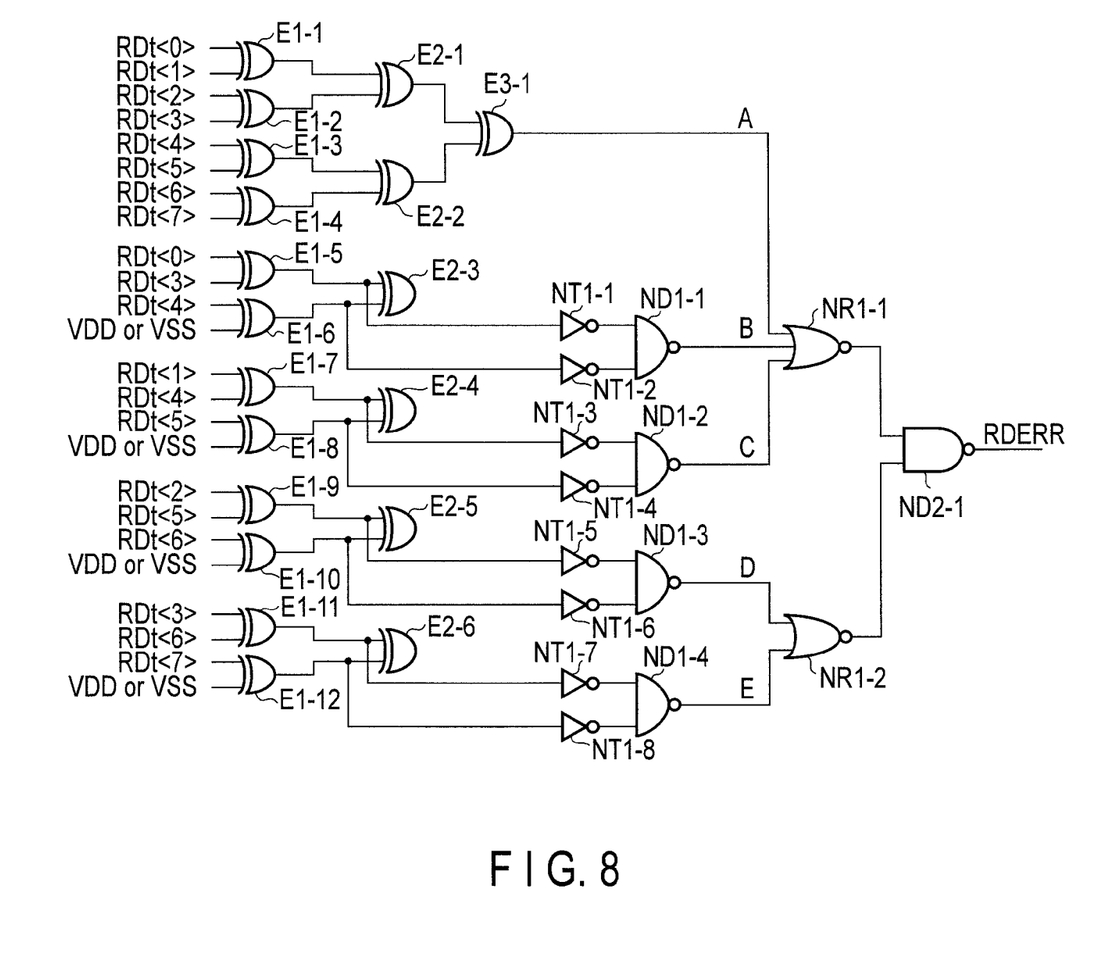
FIGS. 8 and 9 are circuit diagrams of the data compression circuit according to the second embodiment.

FIG. 8 shows an example of the data compression circuit of the second embodiment.

Referring to FIG. 8, data RDt<0>, RDt<1>, . . . , RDt<7> are respectively input to the first and second input terminals of EX-OR gates E1-1, E1-2, E1-3, and E1-4.

For example, data RDt<0>, RDt<3>, and RDt<4> are respectively input to the first and second input terminals of EX-OR gate E1-5 and the first input terminal of EX-OR gate E1-6. A power supply voltage VDD (1) or reference voltage VSS (0) is input as the adjustment bit data to the second input terminal of EX-OR gate E1-6.

For example, data RDt<1>, RDt<4>, and RDt<5> are respectively input to the first and second input terminals of EX-OR gate E1-7 and the first input terminal of EX-OR gate E1-8. The power supply voltage VDD (1) or reference voltage VSS (0) is input as the adjustment bit data to the second input terminal of EX-OR gate E1-8.

For example, data RDt<2>, RDt<5>, and RDt<6> are respectively input to the first and second input terminals of EX-OR gate E1-9 and the first input terminal of EX-OR gate E1-10. The power supply voltage VDD (1) or reference voltage VSS (0) is input as the adjustment bit data to the second input terminal of EX-OR gate E1-10.

For example, data RDt<3>, RDt<6>, and RDt<7> are respectively input to the first and second input terminals of EX-OR gate E1-11 and the first input terminal of EX-OR gate E1-12. The power supply voltage VDD (1) or reference voltage VSS (0) is input as the adjustment bit data to the second input terminal of EX-OR gate E1-12. The rest of the configuration is the same as the circuit shown in FIG. 7.

Assume that in FIG. 8, the output terminal of EX-OR gate E3-1 is node A, and the output terminals of NAND gates ND1-1, ND1-2, ND1-3, and ND1-4 are respectively nodes B, C, D, and E.

In this configuration, a data pattern by which all nodes A, B, C, D, and E shown in FIG. 8 are 0 is read as follows. An output node RDERR outputs 1 when uncompressed data contains error data, and outputs 0 when uncompressed data contains no error data. Thus, an error in compressed data can be detected in accordance with the value of the output node RDERR.

When a readable data pattern is a data pattern in which the number of 0s and the number of 1s in each bit of compressed data are equal, i.e., a data pattern like 00, FF, AA, 55, 0F, or F0, error data existing in data can be detected after the data is compressed. In this case, however, adjustment bit data 1 or 0 must be input to the input terminals of EX-OR gates to which no data is input, so that nodes B, C, D, and E are 0. That is, 1 or 0 is input to the second input terminal of each of EX-OR gates E1-6, E1-8, E1-10, and E1-12.

In this embodiment, data compression tests can be conducted by various data patterns by changing data patterns to be input to the input pins (input terminals) of the EX-OR gates shown in FIG. 8. Also, node A in FIG. 8 is used in error detection when the number of unequal bits is an odd number, and nodes B, C, D, and E are used in error detection when the number of unequal bits is an even number.

An example of the compression process in the second embodiment will be explained below with reference to FIGS. 9 and 10.

Figure 9:
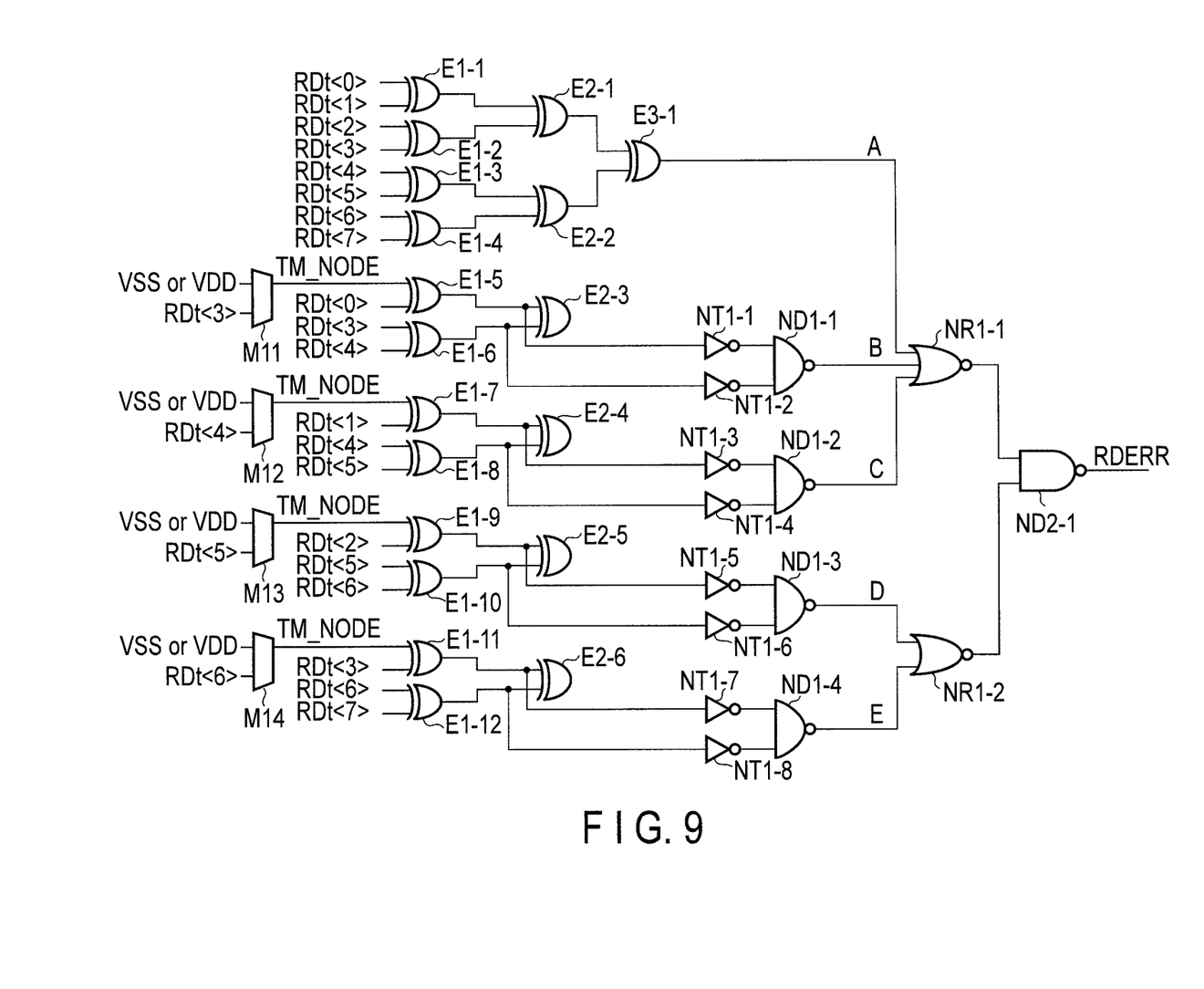

FIG. 9 shows another example of the data compression circuit of the second embodiment.

Referring to FIG. 9, an output node TM_NODE of a multiplexer M11 is connected to the first input terminal of an EX-OR gate E1-5. A power supply voltage VDD (1) or reference voltage VSS (0) as adjustment bit data and data RDt<3> are input to the input terminal of multiplexer M11. Data RDt<3> is, for example, data to be input to the input terminal of an EX-OR gate E1-6 placed near EX-OR gate E1-5.

An output node TM_NODE of a multiplexer M12 is connected to the first input terminal of an EX-OR gate E1-7. The power supply voltage VDD (1) or reference voltage VSS (0) as the adjustment bit data and data RDt<4> are input to the input terminal of multiplexer M12. Data RDt<4> is, for example, data to be input to the input terminal of an EX-OR gate E1-8 placed near EX-OR gate E1-7.

An output node TM_NODE of a multiplexer M13 is connected to the first input terminal of an EX-OR gate E1-9. The power supply voltage VDD (1) or reference voltage VSS (0) as the adjustment bit data and data RDt<5> are input to the input terminal of multiplexer M13. Data RDt<5> is, for example, data to be input to the input terminal of an EX-OR gate E1-10 placed near EX-OR gate E1-9.

An output node TM_NODE of a multiplexer M14 is connected to the first input terminal of an EX-OR gate E1-11. The power supply voltage VDD (1) or reference voltage VSS (0) as the adjustment bit data and data RDt<6> are input to the input terminal of multiplexer M14. Data RDt<6> is, for example, data to be input to the input terminal of an EX-OR gate E1-12 placed near EX-OR gate E1-11.

An output node RDERR of a NAND gate ND2-1 outputs a compression result (error value). The rest of the configuration is the same as the circuit shown in FIG. 7.

Figure 10:
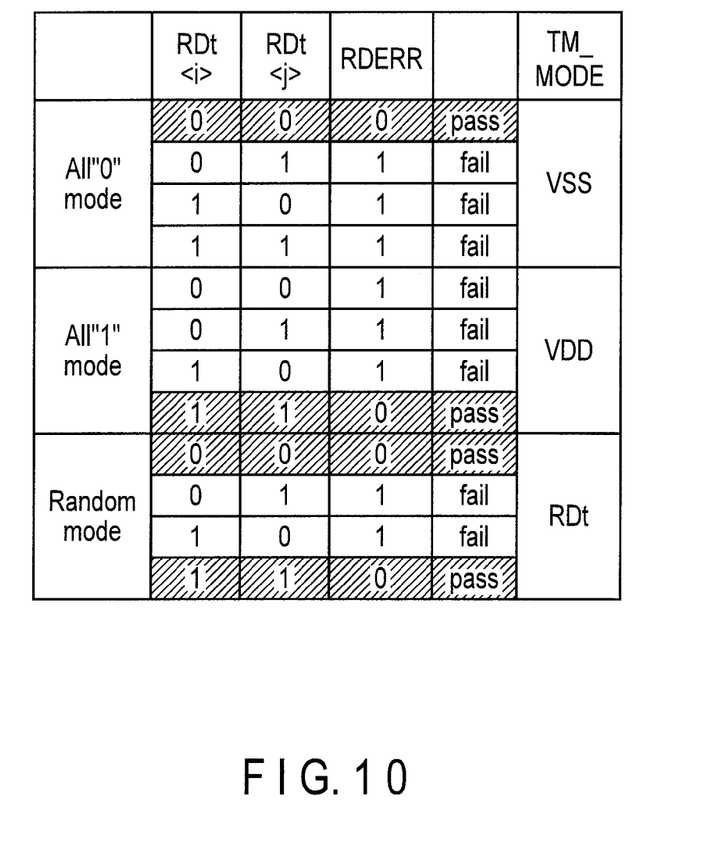
FIG. 10 is a view showing a compression process in the data compression circuit shown in FIG. 9.

FIG. 10 is a view showing the compression process in the data compression circuit shown in FIG. 9.

A mode of inputting data 0 for all DQs, a mode of inputting data 1 for all DQs, and a mode in which 0 and 1 coexist will be described below. DQ is 8-bit data such as data RDt<0> to RDt<7>, or data RDt<8> to RDt<15>. 8 bit data after data RDt<8>, for example, 8 bit data such as data RDt<8> to RDt<15> can also be processed by the same circuit as the circuit for compressing data RDt<0> to RDt<7> shown in FIG. 9.

(1) Compression in Mode of Inputting Data 0

In the mode of inputting data 0, multiplexers M11 to M14 output 0 to the nodes TM_NODE, thereby inputting 0 to the first input terminals of EX-OR gates E1-5, E1-7, E1-9, and E1-11.

When data RDt<i> and RDt<j> are 0, i.e., when all data RDt<0> to RDt<7> are 0, the output node RDERR becomes 0. Consequently, it is possible to detect that no error (error data) exists in data RDt<0> to RDt<7> (pass). Note that i is an arbitrary number of 0, 1, . . . , 7 except for j, and j is an arbitrary number of 0, 1, . . . , 7 except for i.

When one of data RDt<i> and RDt<j> is 0 and the other is 1, the output node RDERR becomes 1. Accordingly, it is possible to detect that an error exists in data RDt<0> to RDt<7> (fail).

When data RDt<i> and RDt<j> are 1, i.e., when an even number of data of data RDt<0> to RDt<7> are 1, the output node RDERR becomes 1. This makes it possible to detect that an error exists in data RDt<0> to RDt<7> (fail).

(2) Compression in Mode of Inputting Data 1

In the mode of inputting data 1, multiplexers M11 to M14 output 1 to the nodes TM_NODE, thereby inputting 1 to the first input terminals of EX-OR gates E1-5, E1-7, E1-9, and E1-11.

When data RDt<i> and RDt<j> are 0, i.e., when an even number of data of data RDt<0> to RDt<7> are 0, the output node RDERR becomes 1. Consequently, it is possible to detect that an error exists in data RDt<0> to RDt<7> (fail).

When one of data RDt<i> and RDt<j> is 0 and the other is 1, the output node RDERR becomes 1. Accordingly, it is possible to detect that an error exists in data RDt<0> to RDt<7> (fail).

When data RDt<i> and RDt<j> are 1, i.e., when all data RDt<0> to RDt<7> are 1, the output node RDERR becomes 0. This makes it possible to detect that no error exists in data RDt<0> to RDt<7> (pass).

(3) Compression in Mode in which 0 and 1 Coexist

In the mode in which 0 and 1 coexist, multiplexers M11 to M14 respectively output data RDt<3>, RDt<4>, RDt<5>, and RDt<6> to the output nodes TM_NODE, thereby respectively inputting data RDt<3>, RDt<4>, RDt<5>, and RDt<6> to the first input terminals of EX-OR gates E1-5, E1-7, E1-9, and E1-11.

When data RDt<i> and RDt<j> are 0, i.e., when all data RDt<0> to RDt<7> are 0, the output node RDERR becomes 0. Consequently, it is possible to detect that no error exists in data RDt<0> to RDt<7> (pass).

When one of data RDt<i> and RDt<j> is 0 and the other is 1, the output node RDERR becomes 1. Accordingly, it is possible to detect that an error exists in data RDt<0> to RDt<7> (fail).

When data RDt<i> and RDt<j> are 1, i.e., when all data RDt<0> to RDt<7> are 1, the output node RDERR becomes 0. This makes it possible to detect that no error exists in data RDt<0> to RDt<7> (pass).

In the second embodiment as described above, the output node RDERR inputs one of 0, 1, and the data RDt to the input pin (adjustment bit pin) of the EX-OR gate. A 0 is input to the adjustment bit pin when all DQs are 0, 1 is input to the adjustment bit pin when all DQs are 1, and data of a data pin arranged close to the input pin of the EX-OR gate is input to the adjustment bit pin in the mode in which 0 and 1 coexist. Even when 0 and 1 coexist in DQs, therefore, an error value can be output to the output pin of the data compression circuit if the data RDt contains error data.

In the second embodiment as has been explained above, the DQ compression circuit can be formed by using a part of the ECC circuit without deteriorating the performance of ECC calculations. This makes it possible to suppress an increase in area caused by the formation of the DQ compression circuit. In the second embodiment, it is also possible to conduct compression tests by using many data patterns.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first memory circuit including a memory cell array and a register, the memory cell array including a plurality of memory cells having magnetic tunnel junction (MTJ) elements, and the register storing (i) one of an open page policy and a closed page policy, and (ii) a read page size in accordance with said one of the open page policy and the closed page policy; and
a first controller configured to access the first memory circuit by said read page size and said one of the open page policy and the closed page policy stored in the register.

2. The device according to claim 1, wherein when completing access to the first memory circuit in the open page policy, the first controller terminates the process without precharging the accessed memory cell array.

3. The device according to claim 1, wherein when completing access to the first memory circuit in the closed page policy, the first controller precharges the accessed memory cell array and terminates the process.

4. The device according to claim 1, wherein in the open page policy, the first controller performs page read by a first read command and burst read by a second read command with respect to the first memory circuit.

5. The device according to claim 1, wherein
the first memory circuit includes a buffer configured to hold data, and
in the open page policy, the first controller performs data transfer from the memory cell array to the buffer in the first memory circuit by a first read command and burst read by a second read command with respect to the first memory circuit.

6. The device according to claim 1, further comprising:
a bus connected to the first memory circuit and the first controller; and
a second memory circuit and a second controller connected to the bus,
wherein the second controller accesses the second memory circuit by one of the open page policy and the closed page policy.

7. The device according to claim 6, wherein the second memory circuit comprises a dynamic random access memory (DRAM).

8. The device according to claim 1, wherein each of the memory cells includes a magnetic tunnel junction (MTJ) element.

9. A semiconductor memory device comprising:
a first memory circuit including a memory cell array and a register, the register storing (i) one of an open page policy and closed page policy, and (ii) a read page size in accordance with said one of the open page policy and closed page policy; and
a first controller configured to access the first memory circuit by said read page size and said one of the open page policy and closed page policy stored in the register.

10. The device according to claim 9, wherein when completing access to the first memory circuit in the open page policy, the first controller terminates the process without precharging the accessed memory cell array.

11. The device according to claim 9, wherein when completing access to the first memory circuit in the closed page policy, the first controller precharges the accessed memory cell array and terminates the process.

12. The device according to claim 9, wherein in the open page policy, the first controller performs page read by a first read command and burst read by a second read command with respect to the first memory circuit.

13. The device according to claim 9, wherein
the first memory circuit includes a buffer configured to hold data, and
in the open page policy, the first controller performs data transfer from the memory cell array to the buffer in the first memory circuit by a first read command and burst read by a second read command with respect to the first memory circuit.

14. The device according to claim 9, further comprising:
a bus connected to the first memory circuit and the first controller; and
a second memory circuit and a second controller connected to the bus,
wherein the second controller accesses the second memory circuit by one of the open page policy and the closed page policy.

15. The device according to claim 14, wherein the second memory circuit comprises a dynamic random access memory (DRAM).

16. The device according to claim 9, wherein the memory cell array includes a plurality of memory cells having magnetic tunnel junction (MTJ) elements.

* * * * *